United States Patent [19]
Kanber

[11] Patent Number: 5,312,765
[45] Date of Patent: May 17, 1994

[54] METHOD OF FABRICATING THREE DIMENSIONAL GALLIUM ARSENIDE MICROELECTRONIC DEVICE

[75] Inventor: Hilda Kanber, Rolling Hills Estates, Calif.

[73] Assignee: Hughes Aircraft Company, Los Angeles, Calif.

[21] Appl. No.: 59,520

[22] Filed: May 11, 1993

Related U.S. Application Data

[63] Continuation of Ser. No. 723,099, Jun. 28, 1991, abandoned.

[51] Int. Cl.$^5$ ............................................. H01L 21/265
[52] U.S. Cl. ....................................... 437/22; 437/133; 437/203; 437/218; 437/915; 148/DIG. 164; 257/74; 257/278; 257/169
[58] Field of Search .................... 257/74, 278, 169; 437/22, 129-133, 203-208, 218, 246, 51, 915; 148/DIG. 164

[56] References Cited

U.S. PATENT DOCUMENTS

| | | | |
|---|---|---|---|
| 3,748,548 | 7/1973 | Haisty et al. | 257/278 |
| 4,396,437 | 8/1983 | Kwok et al. | 437/41 |
| 4,450,464 | 5/1984 | Yamada | 257/278 |
| 4,547,792 | 10/1985 | Sclar | 257/278 |
| 4,782,023 | 11/1988 | Farrier et al. | 437/203 |
| 4,902,637 | 2/1990 | Kondou et al. | 148/DIG. 164 |
| 4,972,248 | 11/1990 | Kornreich et al. | 257/74 |
| 4,978,639 | 12/1990 | Hua et al. | 148/DIG. 135 |
| 5,039,628 | 8/1991 | Carey | 437/203 |
| 5,077,231 | 12/1991 | Plumton et al. | 437/133 |
| 5,084,742 | 1/1992 | Tokuda | 357/16 |

FOREIGN PATENT DOCUMENTS

| | | | |
|---|---|---|---|
| 63-073643 | 4/1988 | Japan | 437/203 |
| 3-41769 | 2/1991 | Japan | 437/129 |

Primary Examiner—Olik Chaudhuri
Assistant Examiner—Ramamohan Rao Paladugu
Attorney, Agent, or Firm—Georgann S. Grunebach; Elizabeth E. Leitereg; Terje Gudmestad

[57] ABSTRACT

Optoelectronic devices (16) are formed on a first surface (12) of a gallium arsenide substrate (10) using selective ion implantation. Signal processing devices may be formed on a second, opposite surface (14) of the substrate (10) using selective ion implantation (38) and/or selective epitaxy (22,24),(40). Vertical interconnects (34,46) are formed between the first and second surfaces (12,14). Alternatively, a gallium arsenide buffer layer (54) may be grown on the first surface (12) of the substrate (10), and the signal processing devices formed on the buffer layer (54) using selective ion implantation (58,60,62) and/or selective epitaxy (76,78,80,82). Dielectric (50) and/or conductive metal (52) layers may be formed on selected areas of the first surface (12), and the buffer layer (54) grown from exposed areas (56) of the first surface (12) over the dielectric (50) and/or metal (52) layers using lateral epitaxial overgrowth organometallic chemical vapor deposition. The signal processing devices may be formed in areas of the buffer layer (54) which overlie the exposed areas (56) of the substrate (12), and/or over the dielectric (50) and/or metal (52) layers. The present method enables metal-semiconductor field effect transistors (MESFET), high electron mobility transistors (HEMT) and heterojunction bipolar transistors (HBT) to be monolithically integrated in a vertical fashion for close packing density.

24 Claims, 4 Drawing Sheets

METHOD OF FABRICATING THREE DIMENSIONAL GALLIUM ARSENIDE MICROELECTRONIC DEVICE

This is a continuation of application Ser. No. 07/723,099, filed Jun. 28, 1991, now abandoned.

BACKGROUND OF THE INVENTION

1. Field of the Invention

The present invention relates to the fabrication of a vertically stacked microelectronic device layer structure on a gallium arsenide (GaAs) substrate which enables the fabrication of three dimensional microelectronic devices therein.

2. Description of the Related Art

The development of microelectronic device fabrication technology on GaAs substrates, especially in the area of monolithic microwave integrated circuits (MMIC), is progressing to the point at which the two dimensional packing density of components such as single chip mixers, local oscillators and amplifiers is approaching a saturation value. Increasing the component density on a chip requires that the device structure be expanded from two to three dimensions.

Three dimensional epitaxial device structures have been proposed on silicon substrates, such as described in U.S. Pat. No. 4,771,013, entitled "PROCESS OF MAKING A DOUBLE HETEROJUNCTION 3-D I$^2$L BIPOLAR TRANSISTOR WITH A SI/GE SUPERLATTICE", issued Sep. 13, 1988, to P. Curran. However, the epitaxial deposition technologies used for silicon typically require processing at temperatures in excess of 1,000° C., which is far above the dissociation temperature (550° C.) of GaAs, and the typical annealing temperatures for GaAs in the range of 800°–900° C.

Vertically stacked epitaxial structures may be formed on GaAs substrates using vapor phase epitaxy or organometallic chemical vapor deposition (OMCVD) at lower temperatures. However, epitaxy is an expensive and one at-a-time process. Epitaxial layers grown by these processes are highly non-uniform in thickness, and doping is not very reproducible. In addition, epitaxial structures are non-planar, and have to be combined with other components in a hybrid manner due to the inherent incompatibility of the profiles.

High density integrated circuits are conventionally fabricated on GaAs substrate wafers which must be thinned down to approximately 100 micrometers to provide sufficient power dissipation. Electrically conductive vertical interconnects (vias) must be formed through the wafers to dissipate power from the devices on the frontside to a ground plane or heat sink on the backside. The thinning process results in a high damage rate during manufacture of the integrated circuits. The vias make the wafers even more fragile.

SUMMARY OF THE INVENTION

The present invention enables vertical integration of microelectronic devices on GaAs or other semi-insulating substrates to achieve higher device packing densities, superior high speed performance, and to enable multi-function and parallel electronic processing capabilities. The combination of various device technologies, such as metal-semiconductor field effect transistors (MESFET), high electron mobility transistors (HEMT) and heterojunction bipolar transistors (HBT) using multi-layer approaches creates the possibility of MMICs with greater density and more versatility.

The present invention overcomes the limitations of the prior art and achieves the above goals by combining ion implantation with selective epitaxy to form three dimensional integrated circuits on GaAs substrates. More specifically, optoelectronic devices are formed on a first surface of the substrate using ion implantation. Signal processing devices may be formed on a second, opposite surface of the substrate using ion implantation and/or selective epitaxy. Vertical interconnects are formed between the first and second surfaces. Alternatively, a gallium arsenide buffer layer may be grown on the first surface of the substrate, and the signal processing devices formed on the buffer layer using ion implantation and/or selective epitaxy. Dielectric and/or conductive metal layers may be formed on selected areas of the first surface, and the buffer layer grown from exposed areas of the first surface over the dielectric and/or metal layers using lateral epitaxial overgrowth organometallic chemical vapor deposition. The signal processing devices may be formed in areas of the buffer layer which overlie the exposed areas of the substrate, and/or over the dielectric and/or metal layers.

The ion implanted devices which are formed directly in the surfaces of the substrate are buried, thereby maintaining the substrate surfaces planar for subsequent epitaxial deposition. Ion implantation is a low cost, high through-put, uniform, selective and reproducible manufacturing technology. Combining two or more ion implanted layers with an epitaxial layer enables the fabrication of three dimensional, vertically stacked microelectronic devices in GaAs in a monolithic and planar arrangement.

As yet another advantage of the present invention, vertical distribution of the microelectronic devices enables the substrate to be made thicker and still provide the required power dissipation. The vias may also be made larger due to the increased thickness and strength of the substrate, providing a further improvement in heat dissipation efficiency.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
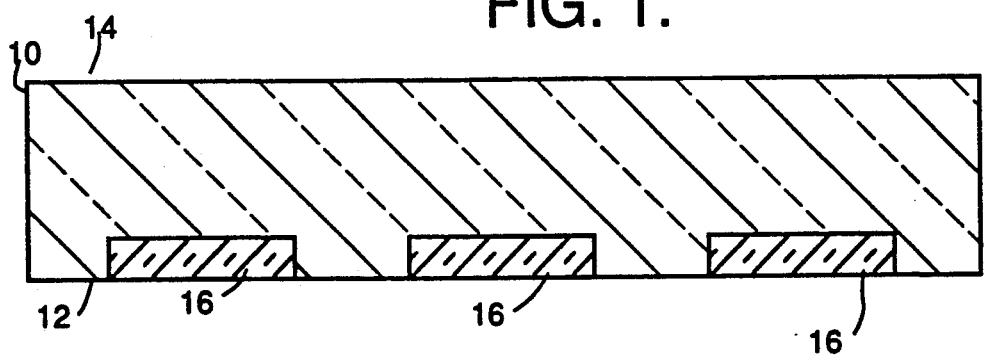
FIGS. 1 to 4 are simplified sectional views illustrating a first method of fabricating a microelectronic device structure embodying the present invention.

Referring to FIG. 1 of the drawing, a substrate 10 of a semi-insulating material has a first surface 12 and a second surface 14. The substrate 10 is preferably formed of GaAs, but the invention is not so limited, and may be practiced using other semi-insulating substrates such as indium phosphide (InP) or indium gallium arsenide (InGaAs). The present method may further be practiced using semi-insulating layers or areas formed on insulating substrates, or silicon-on-insulator (SOI) structures such as silicon-on-sapphire (SOS) wafers, although not specifically illustrated.

In the first step of the process illustrated in FIG. 1, first microelectronic devices 16 are formed in the first surface 12 of the substrate 10 using selective ion implantation. The first devices 16 are laterally spaced from each other, may be similar or different as desired, and may be selected from a wide range of field effect transistor, optoelectronic, or other devices depending on the particular application. The devices 16 are buried under the first surface 12, thereby maintaining the surface 12 in a planar state which is desirable for subsequent processing.

Selective ion implantation technology suitable for forming the devices is known in the art per se, such as described in U.S. Pat. No. 4,396,437, entitled "SELECTIVE ENCAPSULATION, CONTROLLED ATMOSPHERE ANNEALING FOR III-V SEMICONDUCTOR DEVICE FABRICATION", issued Aug. 2, 1983, to S. Kwok et al, and assigned to the Hughes Aircraft Company, the assignee of the present invention. Typically, the substrate 10 will be about 250 micrometers thick. The ion species used is preferably silicon, implanted to a concentration of on the order of 1 to $4 \times 10^{17}$ ions/cm$^3$ and a depth of about 0.07 to 0.12 micrometers, at a power level of about 70 to 120 KeV. Subsequent to implantation, the devices 16 are activated by annealing. The annealing may be performed at a temperature higher than the dissociation temperature of GaAs under an arsine overpressure as described in the above referenced patent to Kwok et al, and also in U.S. Pat. No. 4,473,929, entitled "PROCESS FOR FABRICATING GaAs FET WITH ION IMPLANTED CHANNEL LAYER", issued Oct. 2, 1984, to M. Feng et al, and assigned to the Hughes Aircraft Company, the assignee of the present invention.

Figure 2:
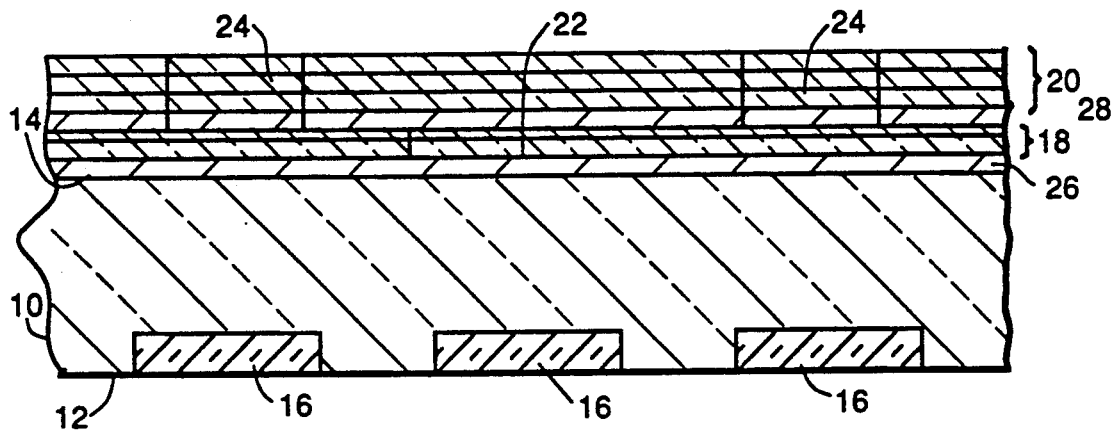

As illustrated in FIG. 2, a first epitaxial layer structure 18 and a second epitaxial layer structure 20 are formed on the second surface 14 of the substrate 10, preferably by selective low pressure OMCVD. The layer structures 18 and 20 may include one or more layers of GaAs, AlGaAs, or other suitable materials, with individual second microelectronic devices 22 and 24 formed therein respectively.

Where the devices 16 are optoelectronic devices such as phototransistors, the devices 22 formed in the first layer structure 18 are preferably low noise signal processing devices, and the devices 24 formed in the second layer structure 20 are power devices for processing signals associated with the optoelectronic devices. The devices 22 and/or 24 may be HEMTs or HBTs, which require epitaxial layer structures and cannot be fabricated by ion implantation. Typically, the layer structures 18 and 20 will be on the order of 0.5 to 2 micrometers thick, although the invention is not so limited. Selective epitaxy deposition suitable for forming the layer structures 18 and 20 is known in the art per se, such as described in an article entitled "SELECTIVE EPITAXY IN THE CONVENTIONAL METALORGANIC PHASE EPITAXY OF GaAs", by T. Kuech et al, in Applied Physics Letters, vol. 54, no. 10, Mar. 6, 1989, pp. 910 to 912.

A first etch stop layer 26 may be formed on the surface 14 under the first layer structure 18, and a second etch stop layer 28 may be formed between the layer structures 18 and 20. The etch stop layers 26 and 28 are formed of a material such as AlGaAs which resists etching in subsequent processing steps, and are typically on the order of 500 to 2,000 Angstroms thick.

Figure 3:
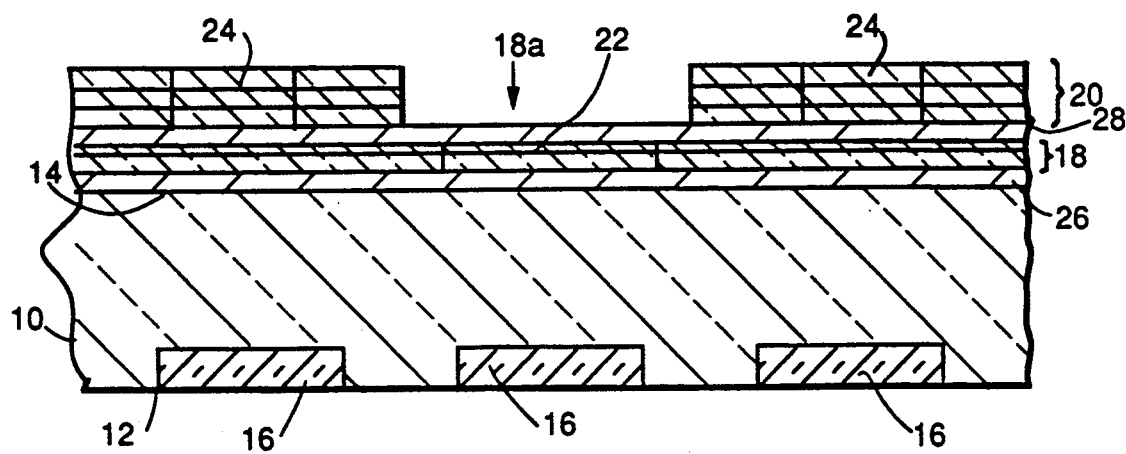

In the next step of the method as illustrated in FIG. 3, the second layer structure 20 is etched away from the first layer structure 18 over a selected area 18a of the layer structure 18. It will be understood that although only one area 18a is shown in the drawing, an actual structure fabricated using the present method will typically include a large number of such areas 18a.

The preferred technology for performing the etching illustrated in FIG. 3 is reactive ion etching such as described in an article entitled "USE OF THIN AlGaAs and InGaAs STOP-ETCH LAYERS FOR REACTIVE ION ETCH PROCESSING OF III-IV COMPOUND SEMICONDUCTOR DEVICES", by C. Cooper et al, in Applied Physics Letters, vol. 51, no. 26, Dec. 28, 1987, pp 2225-2226. However, it is within the scope of the invention to perform the etching illustrated in FIG. 3 using other methods, such as conventional masking and chemical etching.

Figure 4:
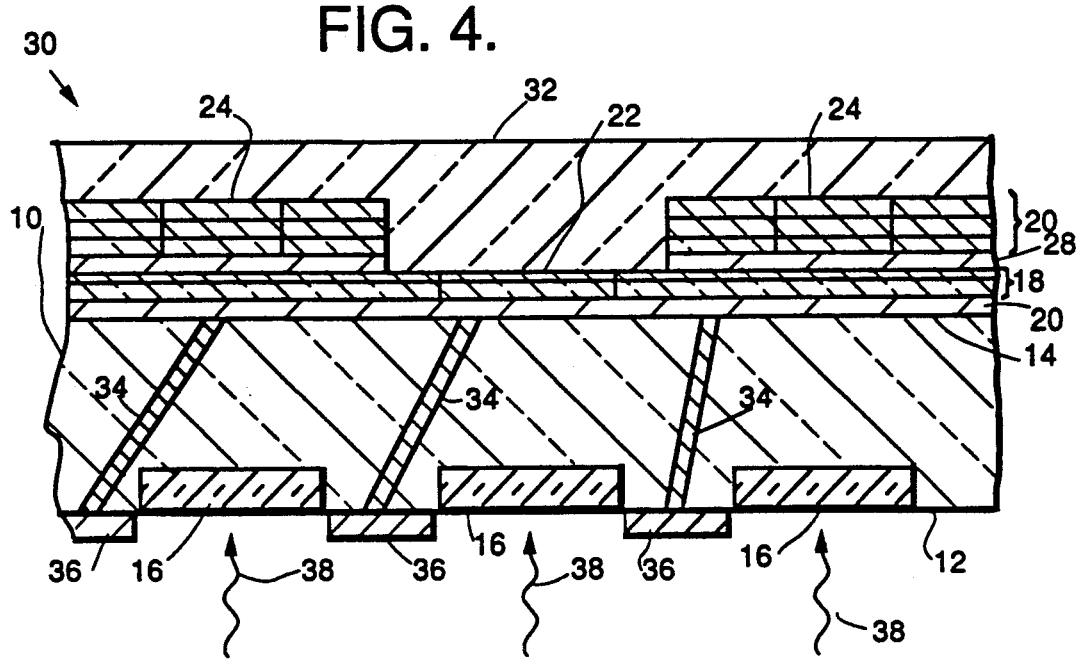

FIG. 4 illustrates the results of additional steps performed to complete a microelectronic device structure 30 embodying the present invention. The etch stop layer 28 is stripped away from the first layer structure 18 over the area 18a, and a protective dielectric overlay layer 32 of silicon dioxide (SiO$_2$) or silicon nitride (Si$_3$N$_4$) is formed over the exposed areas of the layer structures 18 and 20.

Vias 34 are formed through the substrate 10 from the first surface 12 to the second surface 14 thereof using reactive ion etching to form holes, followed by electroplating to fill or at least coat the walls of the holes with an electrically and thermally conductive metal. The vias 34 may extend perpendicular to the surface 12, or at angles thereto as illustrated. The etch stop layer 26 prevents the via etching to affect the epitaxial layer structures 18 and 20. Due to the vertical integration of devices in the structure 30, the substrate 10 may be made thicker than with conventional GaAs technology, and the vias 34 may also be larger to improve power dissipation without excessively weakening the substrate 10. The vias 34 may typically have a cross-sectional area on the order of 3,600 to 37,500 micrometers$^2$.

As further illustrated in FIG. 4, backside metallizations 36 are formed of an electrically conductive metal such as gold (Au), platinum (Pt), aluminum (Al), etc. on the first surface 12 of the substrate 10 to provide a ground plane and heat sink for heat generated during operation of the devices 16, 22 and 24. The vias 34 aid in conducting heat from the devices 22 and 24 through the substrate 10 to the metallizations 36.

Where the devices 16 are optoelectronic devices such as an array of phototransistors, the devices 16 may be exposed to an optical beam or signal as indicated by arrows 38. Electrical signals generated by the devices 16 may be transmitted to the devices 22 through the material of the substrate 10, through vias (not shown) which interconnect the devices 16 and 22, or through metallizations (not shown) which wrap around the edges of the substrate 10.

Figure 5:
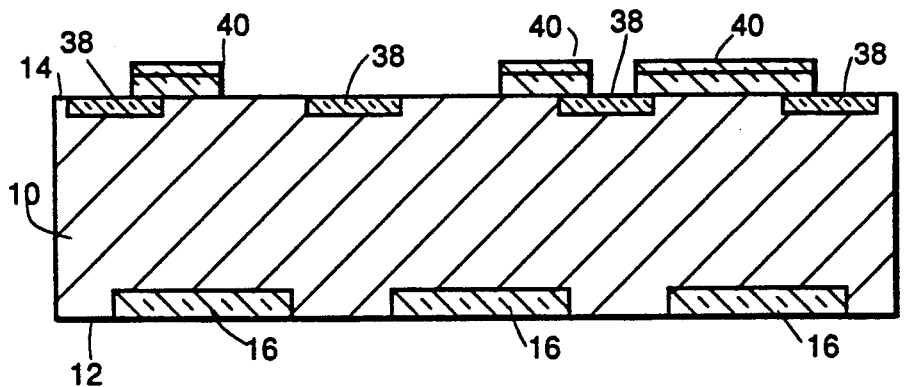
FIGS. 5 and 6 are simplified sectional views illustrating a second method of fabricating a microelectronic device structure of the invention.
Figure 6:
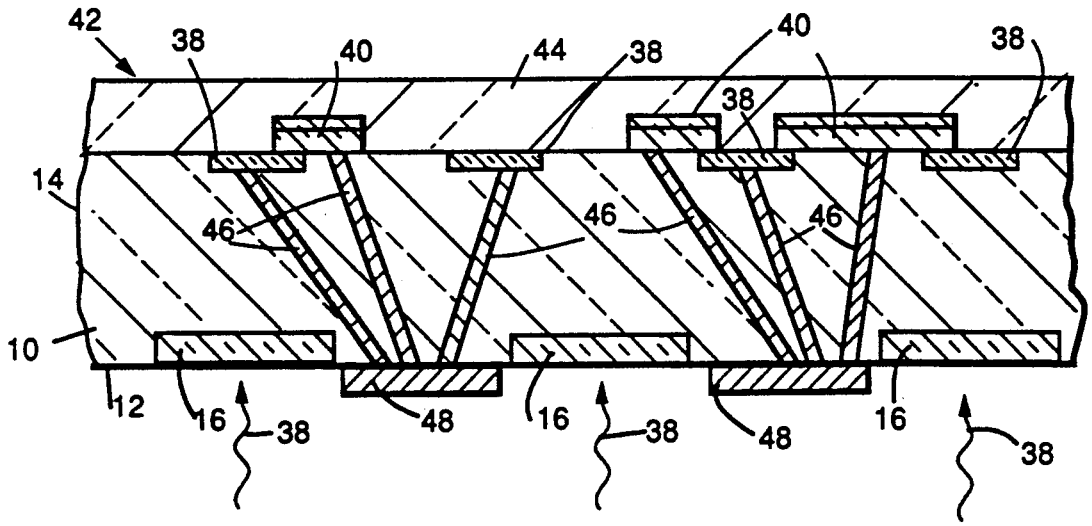

FIGS. 5 and 6 illustrate the fabrication of a second microelectronic device structure according to the present invention. Subsequent to fabrication of the first devices 16 the surface 12 by ion implantation as illustrated in FIG. 1, second microelectronic devices 38 are fabricated on the surface 14 by selective ion implantation in the same manner as the first devices 16. The devices 16 and 38 are preferably annealed simultaneously in a unitary process step. Then, third microelectronic devices 40 are formed on the surface 14 using selective epitaxy. The devices 40 typically have an epitaxial layer structure similar to the layer structures 18 and 20 illustrated in FIGS. 2 to 4. Where the first devices 16 are optoelectronic devices, the second devices 38 will typically be low noise and power MESFETs, whereas the devices 40 will be bipolar devices such as HEMTs or HBTs.

A complete microelectronic device structure 42 as illustrated in FIG. 6 is provided by forming a dielectric overlay layer 44 over the surface 14, vias 46 through the substrate 10, and metallizations 48 on the surface 12. The structure 42 features three microelectronic device structures formed in three vertically stacked layers respectively, which are spaced from each other in a direction perpendicular to the surface 12. Both surfaces 12 and 14 of the substrate and the devices 16 and 38 formed therein respectively are coplanar.

Figure 7:
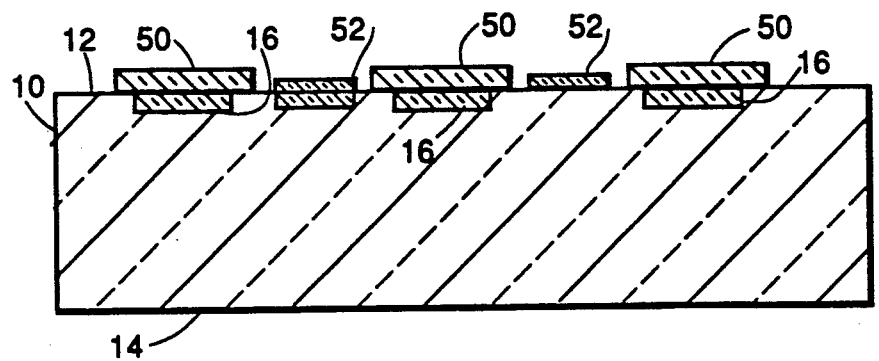
FIGS. 7 to 10 are simplified sectional views illustrating a third method of fabricating a microelectronic device structure of the invention.

FIGS. 7 to 10 illustrate the fabrication of a third microelectronic device structure according to the present invention. Subsequent to the fabrication of the first devices 16 on the first surface 12 of the substrate 10 as illustrated in FIG. 1, a dielectric layer 50 and a metallization layer 52 are formed on selected areas of the surface 12 as illustrated in FIG. 7. It will be noted that the substrate 10 is illustrated in an inverted position in FIG. 7 relative to FIGS. 1 to 6, with the surface 14 being the front or light-receiving surface. Although both the dielectric layer 50 and metallization layer are illustrated in FIG. 7, it is within the scope of the invention to provide only the dielectric layer 50 or only the metallization layer 52. The dielectric layer 50 may be formed of SiO$_2$ or Si$_3$N$_4$ to a thickness on the order of 900 to 1,300 Angstroms, whereas the metallization layer 52 may be formed of Au, Pt, Al, etc. to a thickness of about 1,000 to 5,000 Angstroms.

Figure 8:
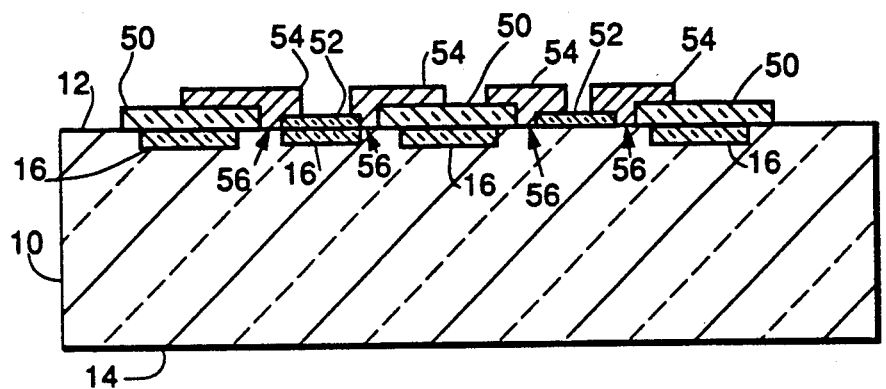

As illustrated in FIG. 8, a buffer layer 54 of a material similar to that of the substrate 10 is formed over selected areas of the first surface 12. Where the substrate 10 is formed of GaAs, the buffer layer 54 will also be formed of GaAs. The buffer layer 54 is preferably formed using selective epitaxy onto the exposed areas 56 of the surface 12, followed by lateral epitaxial overgrowth deposition extending laterally over the adjacent surfaces of the dielectric and metallization layers 50 and 52. The exposed areas 56 of the substrate 10 provide a nucleation seed for monocrystalline growth of GaAs from the surface 12. A technology suitable for fabricating the buffer layer 54 is described in an article entitled "LATERAL EPITAXIAL OVERGROWTH OF GaAs BY ORGANOMETALLIC CHEMICAL VAPOR DEPOSITION", by R. Gale et al, in Applied Physics Letters, vol. 41, no. 6, Sep. 15, 1982, pp. 545–547.

Figure 9:
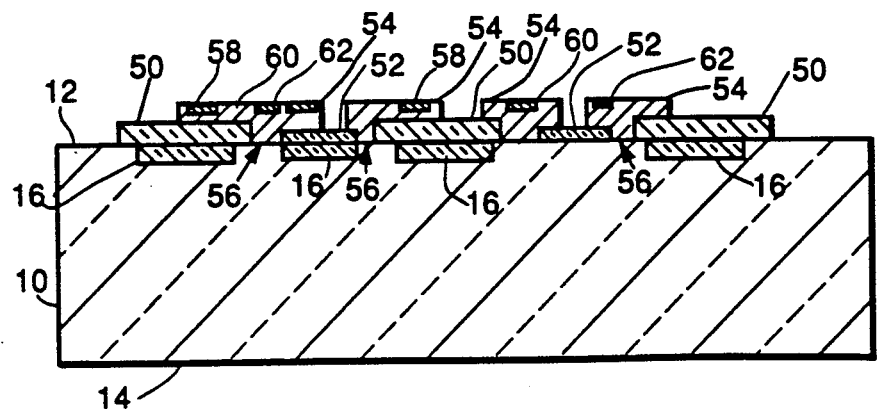

The buffer layer 54 provides a second semi-insulating layer in which microelectronic devices can be fabricated. As illustrated in FIG. 9, second microelectronic devices 58, 60 and 62 are formed on the exposed surface of the buffer layer 54 using selective ion implantation. The devices 58 are formed over the dielectric layers 50, the devices 60 are formed over the exposed areas 56 of the surface 12, whereas the devices 62 are formed over the metallization layer 52. The devices 58, 60 and 62 may be of any desired MESFET type, including low noise and power FETs. Although FIG. 9 illustrates a structure including all of the devices 58, 60, and 62, it is within the scope of the invention to fabricate only the devices 58, only the devices 60, only the devices 62, or combinations of two thereof. Dielectric layer 50 provides isolation between the devices 16 and 58, whereas the metallization 52 provides interconnection as desired.

Figure 10:
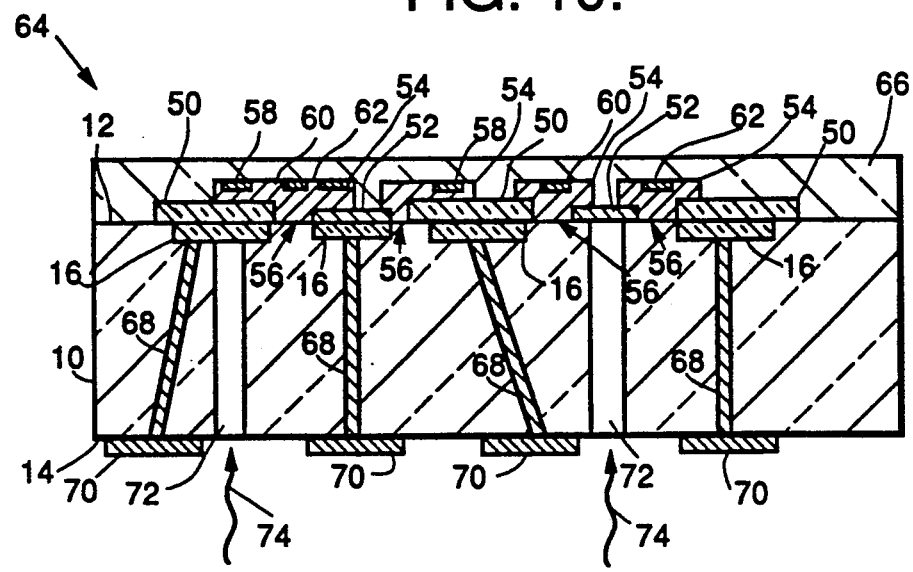

FIG. 10 illustrates a complete microelectronic device structure 64 including a dielectric overlay layer 66, electrically conductive vias 68, and metallizations 70. In addition, hollow vias 72 may be formed through the substrate 10 to enable an optical signal to be incident on the devices 16 as indicated by arrows 74. Although not illustrated, the substrate 10 may be thinned from the surface 14 thereof to about 100 micrometers subsequent to formation of the overlay layer 66, and prior to formation of the metallizations 70.

Figure 11:
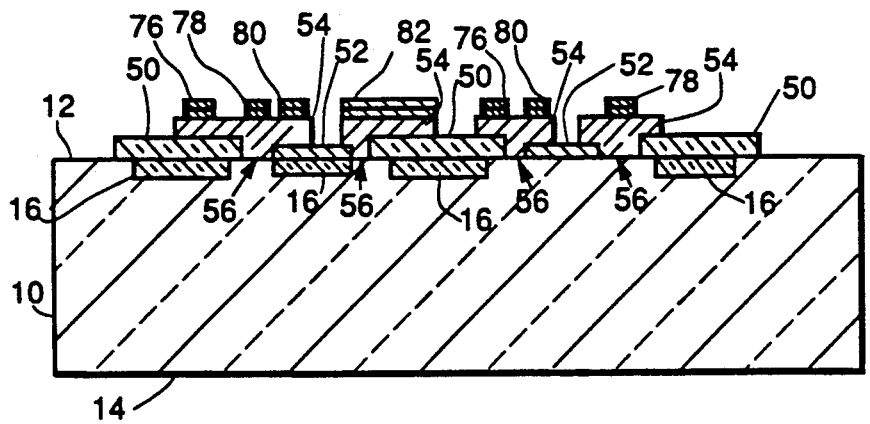
FIGS. 11 and 12 are simplified sectional views illustrating a fourth method of fabricating a microelectronic device structure of the invention.
Figure 12:
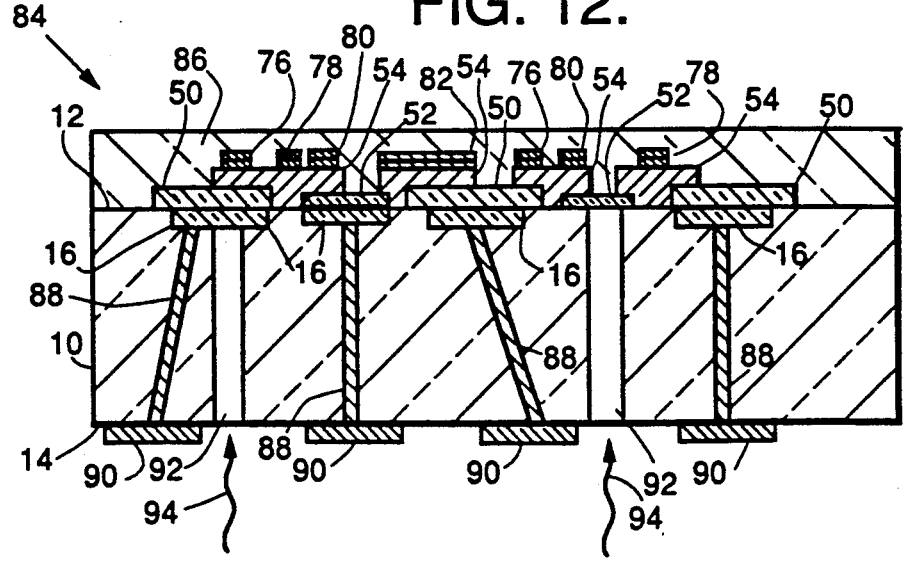

FIGS. 11 and 12 illustrate the fabrication of a fourth microelectronic device structure according to the present invention. Subsequent to fabrication of the structure as illustrated in FIG. 8, second microelectronic devices 76, 78, 80 and 82 are formed on the buffer layer 54 as epitaxial layer structures. The devices 76 are formed over the dielectric layer 50, the devices 78 are formed over the exposed areas 56 of the surface 12, the devices are formed over the metallization layer 52, and the devices 82 span two or all of the layers 50, 52 and exposed areas 56. The devices 76, 78, 80 and 82 may be of any desired type, including HEMTs and HBTs. Although FIG. 11 illustrates a structure including all of the devices 76, 78, 80 and 82, it is within the scope of the invention to fabricate only the devices 76, only the devices 78, only the devices 80, only the devices 82, or combinations of two or three thereof.

FIG. 12 illustrates a complete microelectronic device structure 84 including a dielectric overlay layer 86, electrically conductive vias 88, and metallizations 90. Hollow vias 92 may be formed through the substrate 10 to enable an optical pattern to be incident on the devices 16 as indicated by arrows 94. The substrate 10 may be thinned from the surface 14 thereof to about 100 micrometers subsequent to formation of the overlay layer 86, and prior to formation of the metallizations 90, as with the structure 64 of FIG. 10.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. A method of fabricating a three-dimensional microelectronic device structure, comprising the steps of:
   (a) providing a semi-insulating substrate having first and second opposite surfaces, wherein the semi-insulating substrate comprises a III-V material;
   (b) forming a buried first microelectronic device in said first surface, wherein the first microelectronic device comprises a III-V material and includes active device layers formed using selective ion implantation; and
   (c) forming a second microelectronic device on the substrate, the second device being spaced from the first device in a direction perpendicular to said first surface, wherein the second microelectronic device comprises a III-V material; and (d) forming a vertical interconnect hole through the substrate from the first microelectronic device to the second microelectronic device to electrooptically couple the first microelectronic device to the second microelectronic device.

2. A method as in claim 1, in which:
step (b) comprises forming the first device as including an optoelectronic device; and
step (c) comprises forming the second device as including a signal processing device for processing signals associated with the optoelectronic device.

3. A method as in claim 1, in which step (c) comprises forming the second device on said second surface.

4. A method as in claim 3, in which step (c) comprises epitaxial deposition.

5. A method as in claim 3, in which step (c) comprises the substeps of:
(e) depositing a first epitaxial layer structure on said second surface;
(f) depositing a second epitaxial layer structure on the first epitaxial layer structure; and
(g) removing the second epitaxial layer structure from the first epitaxial layer structure over an area of the first epitaxial layer structure.

6. A method as in claim 5, in which step (g) comprises etching.

7. A method as in claim 5, in which:
step (g) comprises etching; and
the method further comprises the steps of:
(h) after performing step (e) and before performing step (f), forming an etch stop layer of a material which resists etching in step (g) on the first epitaxial layer structure; and
(i) after performing step (g), removing the etch stop layer from the first epitaxial layer structure over said area thereof.

8. A method as in claim 3, in which:
step (c) comprises epitaxial deposition; and
the method further comprises the steps of:
after performing step (b) and before performing step (c), forming an etch stop layer of a material which resists reactive ion etching on said second surface; and
(f) wherein said vertical interconnect layer is formed from the first surface to the etch stop layer using reactive ion etching.

9. A method as in claim 3, in which step (c) comprises selective ion implantation.

10. A method as in claim 9, further comprising the step of:
(e) after performing steps (b) and (c), simultaneously annealing said ion-implanted first and second device.

11. A method as in claim 9, further comprising the step of:
(e) after performing step (c), forming a third microelectronic device on said second surface using selective epitaxial deposition.

12. A method as in claim 1, in which step (c) comprises forming the second device over said first surface.

13. A method as in claim 12, in which step (c) comprises the substeps of:
(e) forming a semi-insulating buffer layer on said first surface; and
(f) forming the second device on the buffer layer.

14. A method as in claim 13, in which step (f) comprises selective ion implantation.

15. A method as in claim 14, further comprising the step of:
(g) after performing steps (b) and (c), simultaneously annealing said ion-implanted first and second device.

16. A method as in claim 13, in which step (f) comprises epitaxial deposition.

17. A method as in claim 13, in which step (e) comprises the substeps of:
(g) forming a dielectric layer on an area of said first surface; and
(h) growing the buffer layer from an exposed area of said first surface over the dielectric layer using selective area epitaxy followed by lateral epitaxial overgrowth deposition.

18. A method as in claim 17, in which step (h) comprises organometallic chemical vapor deposition.

19. A method as in claim 17, in which step (f) comprises forming the second device on an area of the buffer layer which overlies the dielectric layer.

20. A method as in claim 17, in which step (f) comprises forming the second device on an area of the buffer layer which overlies said exposed area of said first surface.

21. A method as in claim 13, in which step (e) comprises the substeps of:
(g) forming an electrically conductive layer on an area of said first surface; and
(h) growing the buffer layer from an exposed area of said first surface over the conductive layer using lateral epitaxial overgrowth deposition.

22. A method as in claim 13, in which step (e) comprises forming the buffer layer of substantially the same material as the substrate.

23. A method as in claim 13, in which:
step (a) comprises providing the substrate as including gallium arsenide; and
step (e) comprises forming the buffer layer as including gallium arsenide.

24. A method as in claim 1, in which step (a) comprises providing the substrate as comprising gallium arsenide.

* * * * *